(12) United States Patent
Komijani et al.

(10) Patent No.: US 9,048,850 B2
(45) Date of Patent: Jun. 2, 2015

(54) FREQUENCY SYNTHESIZER APPARATUS AND METHODS FOR IMPROVING CAPACITOR CODE SEARCH ACCURACY USING LSB MODULATION

(71) Applicant: QUALCOMM Incorporated, San Diego, CA (US)

(72) Inventors: Abbas Komijani, Mountain View, CA (US); Emmanouil Terrovitis, Foster City, CA (US); Justin A. Hwang, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 56 days.

(21) Appl. No.: 13/797,356

(22) Filed: Mar. 12, 2013

(65) Prior Publication Data

US 2014/0002205 A1 Jan. 2, 2014

Related U.S. Application Data

(60) Provisional application No. 61/667,390, filed on Jul. 2, 2012.

(51) Int. Cl.
H03L 7/10 (2006.01)
H03L 7/087 (2006.01)
H03J 5/24 (2006.01)
(Continued)

(52) U.S. Cl.
CPC ............... *H03L 7/103* (2013.01); *H03L 7/113* (2013.01); *H03L 7/087* (2013.01); *H03L 2207/06* (2013.01); *H03J 5/244* (2013.01); *H03J 2200/10* (2013.01); *H03L 7/10* (2013.01); *H03L 7/181* (2013.01)

(58) Field of Classification Search
CPC ........... H03L 7/10–7/102; H03L 7/085; H03L 7/087; H03L 7/099; H03L 7/113; H03L 2207/06; H03J 5/24; H03J 5/242; H03J 5/246; H03J 2200/10
USPC ......... 331/16, 10, 11, 36 C, 1 A, 44; 327/156
See application file for complete search history.

(56) References Cited

U.S. PATENT DOCUMENTS 5,257,294 A * 10/1993 Pinto et al. .................... 375/376
7,064,591 B1 * 6/2006 Humphreys et al. .......... 327/156
7,154,348 B2 * 12/2006 Lee et al. ........................ 331/34
(Continued)

FOREIGN PATENT DOCUMENTS

WO WO-2008066346 A1 6/2008

OTHER PUBLICATIONS

International Search Report and Written Opinion—PCT/US2013/047978—ISA/EPO—Oct. 22, 2013.

*Primary Examiner* — Ryan Johnson
(74) *Attorney, Agent, or Firm* — Mahamedi Paradice LLP

(57) ABSTRACT

A frequency synthesizer is disclosed that includes an oscillator having an output to deliver a signal of a controllable frequency. The oscillator includes a capacitor bank responsive to an N-bit control signal to exhibit a capacitance. The oscillator output frequency is based on the capacitance. Control logic generates the N-bit control signal and determines each bit of the N-bit control signal through a binary search step and a modulation of a least-significant-bit (LSB) of the N-bit control signal. The LSB modulation, combined with the binary search for each bit, results in a higher accuracy frequency estimation.

16 Claims, 7 Drawing Sheets

(51) Int. Cl.
  *H03L 7/113* (2006.01)
  *H03L 7/181* (2006.01)

(56) References Cited

U.S. PATENT DOCUMENTS

| | | |
|---|---|---|
| 7,385,453 B2 * | 6/2008 | Nervegna ........................ 331/176 |
| 7,587,184 B2 | 9/2009 | Der et al. |
| 7,746,182 B2 | 6/2010 | Ramaswamy et al. |
| 8,138,845 B1 | 3/2012 | Zhang et al. |
| 8,169,270 B2 | 5/2012 | Zeng et al. |
| 2005/0083137 A1 | 4/2005 | Lee et al. |
| 2006/0158264 A1 | 7/2006 | Kousai et al. |
| 2007/0109063 A1 * | 5/2007 | Lau et al. ........................ 331/111 |
| 2008/0048788 A1 * | 2/2008 | Yu ................................. 331/16 |
| 2010/0213984 A1 | 8/2010 | Shin et al. |
| 2011/0025436 A1 | 2/2011 | Hadji-Abdolhamid et al. |
| 2011/0057696 A1 | 3/2011 | Hsieh et al. |
| 2013/0187719 A1 * | 7/2013 | Beaulaton et al. ............... 331/16 |

* cited by examiner

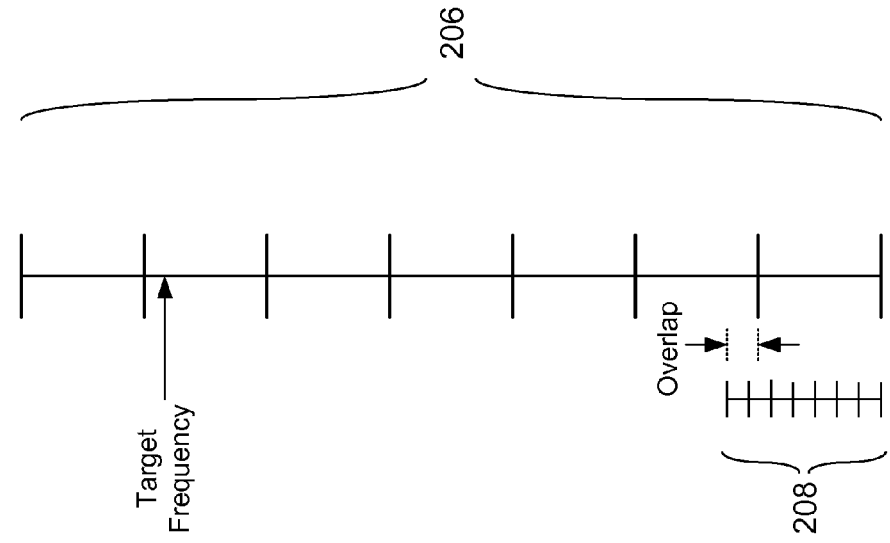
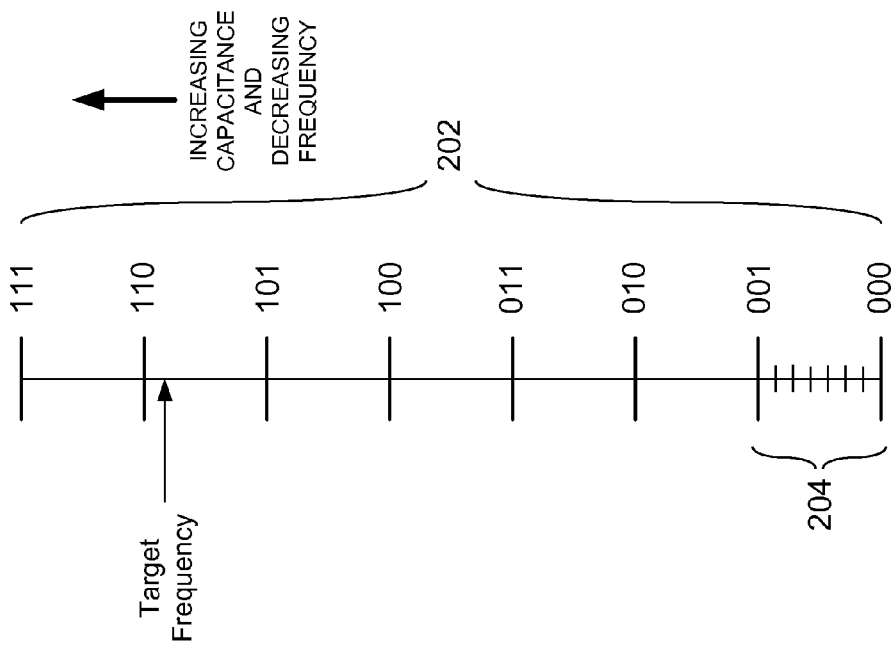

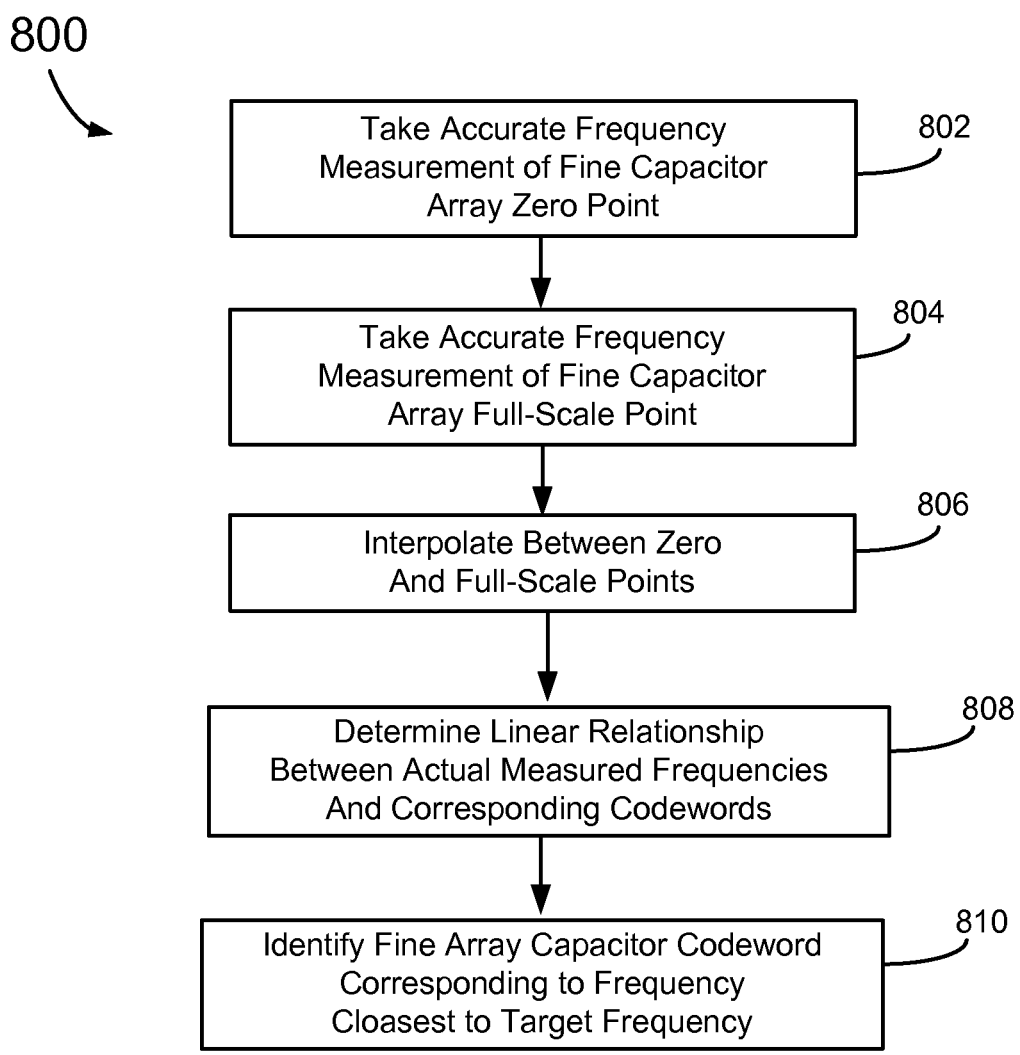

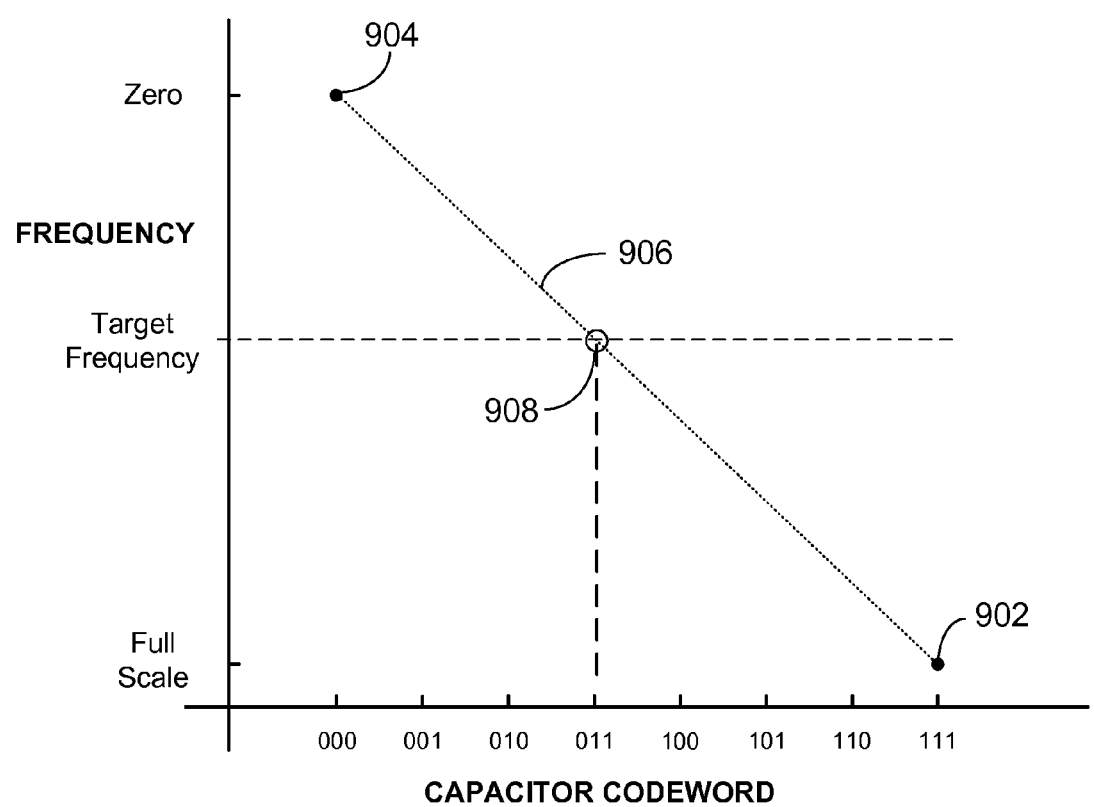

US 9,048,850 B2

FREQUENCY SYNTHESIZER APPARATUS AND METHODS FOR IMPROVING CAPACITOR CODE SEARCH ACCURACY USING LSB MODULATION

RELATED APPLICATIONS

This application claims priority to U.S. Provisional Patent Application No. 61/667,390, titled "Frequency Synthesizer Apparatus and Methods for Improving Lock Time With Overlapping Coarse and Fine Tuning Capacitor Arrays," filed Jul. 2, 2012, which is hereby incorporated by reference in its entirety.

TECHNICAL FIELD

The disclosure herein relates generally to frequency synthesizers and associated methods, and more particularly to synthesizers having tunable capacitor arrays.

BACKGROUND OF RELATED ART

Frequency synthesizers provide a way to adjust and control a frequency of a periodic signal, such as a clock. Synthesizers with wide tuning ranges often employ inductor-capacitor (LC) circuits having adjustable parameters, such as an adjustable capacitance. The capacitance may be generated by a capacitor array that exhibits a desired capacitance in response to an N-bit codeword. Typically, each possible codeword is associated with a range of oscillator frequencies. Thus, a 3-bit codeword may have 8 possible sequences, with each possible sequence corresponding to a sub-range of desired frequencies. Selection of a desired frequency is thus dependent on selection of a proper codeword.

To estimate the appropriate capacitor codeword corresponding to a desired frequency setting, conventional methods of frequency synthesis often employ binary search techniques. One conventional binary search algorithm begins by activating the Nth bit of a given capacitor array, often referred to as the most-significant-bit (MSB). The value of the resulting capacitance is used in an LC circuit for the synthesizer, and the frequency determined via an edge counter. The state of the bit is then determined based on the value of the count, with the frequency generally varying in an inversely proportional manner to the capacitance.

In some situations, especially for voltage-controlled-oscillator (VCO) applications, it may be desirable to reduce a gain associated with the VCO. This often increases the resolution and number of bits of the capacitor array. For applications where the number of bits increases, problems relating to errors in frequency estimations may arise. Generally, allowable error in the VCO frequency estimation is inversely proportional to $2^N$. By increasing the number of bits in the capacitor array, such as by 1, the frequency estimation time doubles. So when the number of bits is increased from N to N+1, the total capacitor search time increases by:

$$(N+1)2^{N+1}/N2^N = 2(N+1)/N$$

Therefore, the capacitor search time increases exponentially with the number of bits in the VCO capacitor codeword. For fast channel switching and stringent locking time requirements, faster methods for estimating a more accurate capacitor codeword are desirable.

SUMMARY

Embodiments of frequency synthesizers are presented herein. In one embodiment, a frequency synthesizer is disclosed that includes an oscillator to generate a signal of a controllable frequency. The frequency synthesizer also includes a counter having an input to receive the signal and to generate a count of a number of periods of the signal within an enabled timing interval. A state machine controls a frequency search of a capacitor codeword associated with the oscillator. The capacitor codeword corresponds to a frequency of the signal. The state machine generates an enable signal to define the enabled timing interval. Gating logic is disposed between the state machine and the counter to re-generate the enable signal proximate the counter. The gating logic is coupled to the oscillator to selectively pass the signal to the counter.

In a further embodiment, a frequency synthesizer is disclosed that includes an oscillator having an output to deliver a signal of a controllable frequency. The oscillator includes a capacitor bank responsive to a multi-bit control signal to exhibit a capacitance. The oscillator output frequency is based on the capacitance. Control logic generates the multi-bit control signal and determines each bit of the multi-bit control signal through a binary search step and a modulation of a least-significant-bit (LSB) of the multi-bit control signal. The LSB modulation, combined with the binary search for each bit, results in a higher accuracy frequency estimation.

In one embodiment, an LSB modulation method may be employed to reduce a maximum estimation error. The method comprises setting a target signal frequency, then searching for a multi-bit capacitor codeword corresponding to the desired frequency. The searching includes evaluating each bit during respective portions of a time interval. During a first portion of the time interval, a first value is generated that is attributable to the current bit and any other previously determined bits. During a second portion of the time interval, a least-significant-bit (LSB) of the multi-bit capacitor codeword is modulated to generate a second value attributable to the currently evaluated bit and the other previously determined bits, and the modulated LSB. A state of the currently evaluated bit is then determined based on a combination of the first and second values. For one specific embodiment, when the LSB is evaluated, a final step of incrementing the LSB of the final codeword is performed.

BRIEF DESCRIPTION OF THE DRAWINGS

The present embodiments are illustrated by way of example and are not intended to be limited by the figures of the accompanying drawings.

FIG. 2A illustrates one embodiment of the capacitor array of FIG. 1.

FIG. 2B illustrates a further embodiment of the capacitor array of FIG. 1.

FIG. 8 illustrates a flowchart for a further embodiment of a capacitor codeword search method that employs an interpolation technique.

FIG. 9 illustrates a graphical depiction of an interpolation operation consistent with the flowchart of FIG. 8 to estimate a fine capacitor array codeword.

DETAILED DESCRIPTION

In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scopes all embodiments defined by the appended claims.

Figure 1:
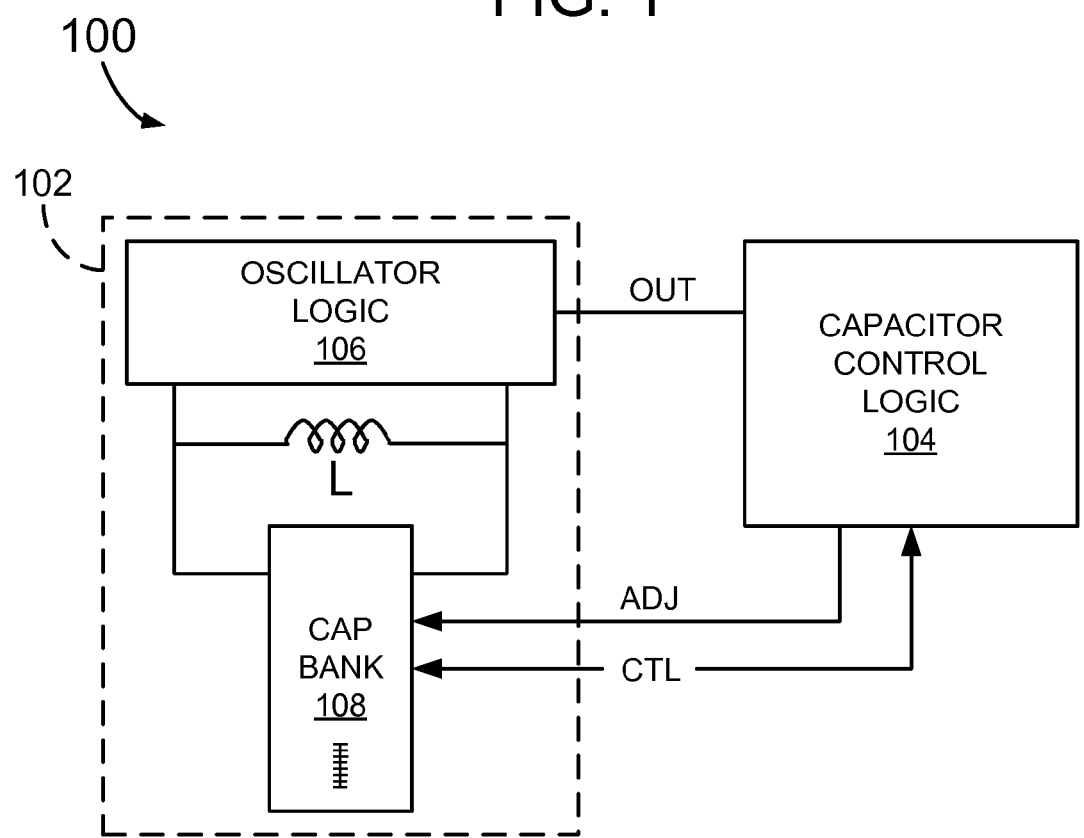
FIG. 1 illustrates one embodiment of a frequency synthesizer circuit.

More specifically, and referring now to FIG. 1, one embodiment of a frequency synthesizer circuit is shown, generally designated 100, that employs an oscillator 102 coupled to capacitor control logic 104. The oscillator 102 includes oscillator logic 106 that may take the form of a voltage-controlled oscillator (VCO). A VCO can generally vary a periodic output signal in response to an input voltage. The oscillator 102 includes a capacitive impedance circuit, such as a capacitor array or bank 108. In some embodiments, the capacitor bank 108 may be coupled to an inductive impedance L to form a tunable LC circuit. The combined inductive and capacitive circuits enable the oscillator 102 to generate an output waveform OUT of a controllable frequency. Other impedances may also be employed, such as resistive impedances in combination with the LC circuit, depending on the application and desired electrical parameters.

For one embodiment, shown in FIG. 2A, the capacitor bank 108 may be represented as a multi-bit coarse array 202 of equally-spaced capacitor circuits, where the aggregate number of control bits define a coded sequence, or codeword, to uniquely identify each coarse capacitor circuit. In this context, "coarse" refers to a relatively wide range in frequencies associated with each possible codeword. Thus, for a coarse array defined by an eight-level capacitor bank, each capacitance level may be uniquely identified by a 3-bit codeword, as shown by the bit sequences 0-0-0 through 1-1-1, in FIG. 2A. A fine array of capacitor circuits 204 may also be employed to improve the resolution of the capacitor bank. As an example, a number N of finely-spaced bits may be used that together span a frequency range defined by a least-significant-bit (LSB) of the coarse array. Thus, a given estimated codeword may have a coarse capacitor array component (a coarse subword), and a fine capacitor array component (a fine subword). For the specific example shown, each capacitor circuit, when activated, may exhibit an amount of capacitance that corresponds to the oscillator output frequency in an inversely proportional manner.

Referring now to FIG. 2B, in a further embodiment, the capacitor bank 108 may take the form of a coarse capacitor array 206 similar to that described above relating to FIG. 2A. A fine capacitor array 208 may also be employed that spans a frequency range that not only fits within a range corresponding to a coarse bit of the coarse capacitor array 206, but overlaps partially into a range defined by a second capacitor circuit such as that indicated by the label "Overlap" in FIG. 2B. The overlap forms a redundant amount of capacitance that may be useful in some situations, as more fully described below.

Referring back to FIG. 1, to select the proper level of capacitance corresponding to a desired target oscillator frequency, the capacitor control logic 104 evaluates an initial capacitor control signal CTL that provides an initial capacitor estimate to achieve the desired target frequency. The capacitor control logic 104 manages a search process, more fully described below, to tune the capacitor bank 108 such that it exhibits a capacitance that results in an oscillator output that has improved accuracy in the value of the output frequency.

Since the capacitor bank or array 108 has a finite number of levels corresponding to each possible capacitor codeword, a range of target frequencies is assigned to each possible codeword. Thus, an error may exist between a desired target frequency, and the actual frequency exhibited by the capacitor codeword assigned to the range of frequencies that includes the target frequency. This is known as quantization error. Apparatus and methods described herein seek to minimize that quantization error.

Figure 3:
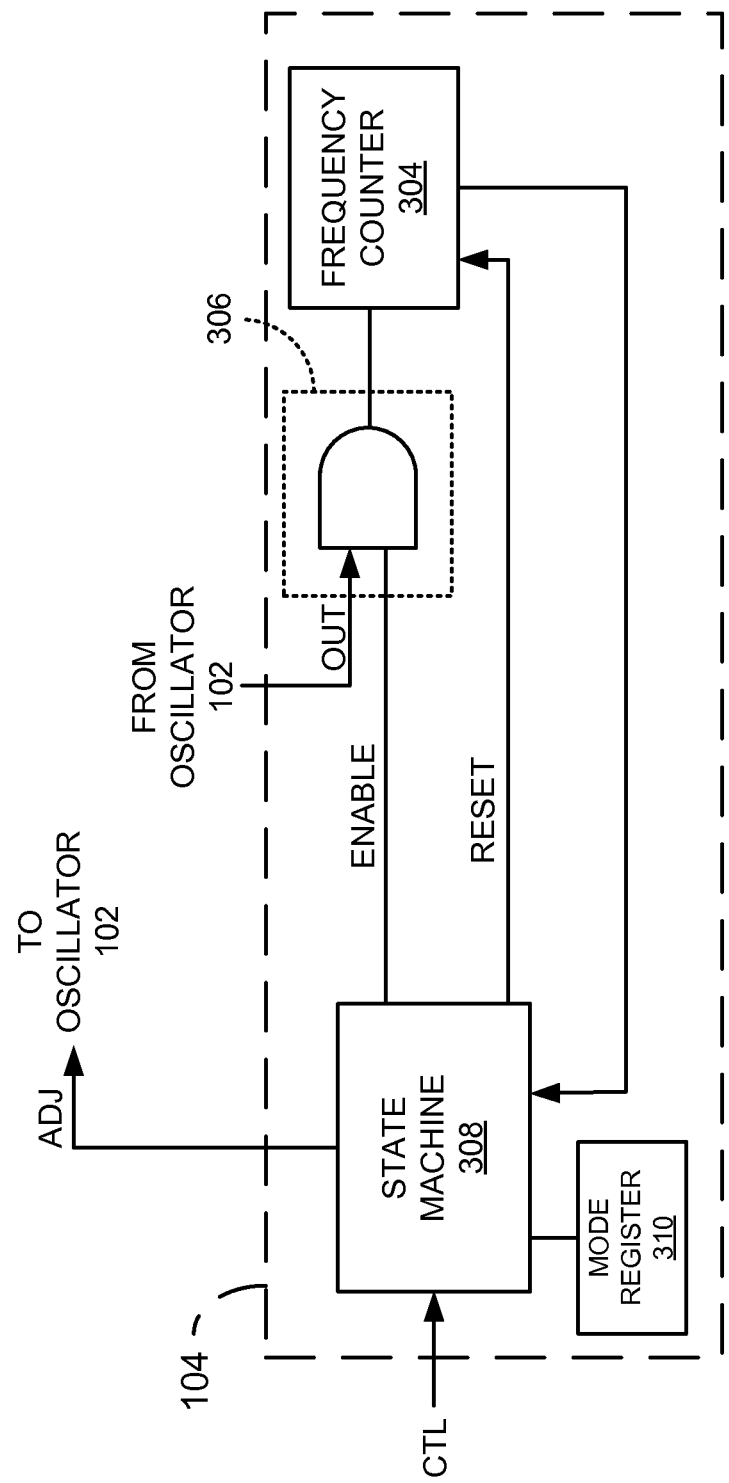
FIG. 3 illustrates further detail of one embodiment of the capacitor control logic of FIG. 1.

FIG. 3 illustrates further detail of one embodiment of the capacitor control logic 104, including gating logic 306, a frequency counter 304, and a state machine 308. The gating logic 306 in one form includes an "AND" gate that has a first input to receive the oscillator output OUT from the oscillator 102, and a second input to receive an enable signal ENABLE. The enable signal ENABLE is generated by the state machine 308 to define a time interval for counting by the frequency counter 304. The count value divided by the time interval generally corresponds to the oscillator frequency.

Figure 4:
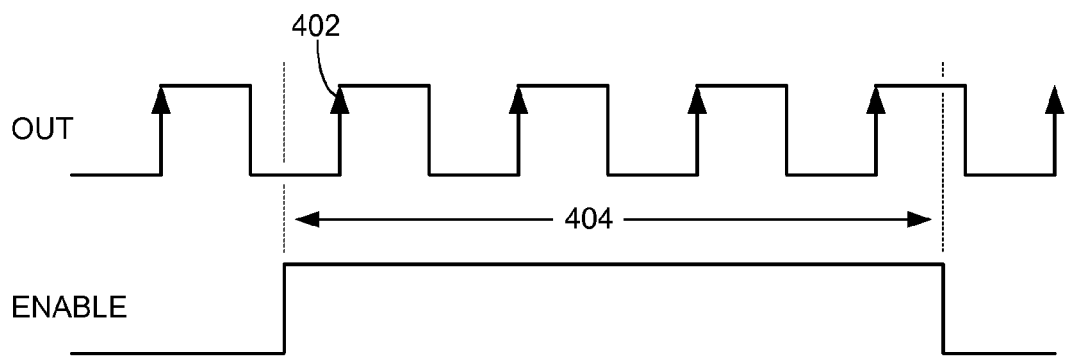
FIG. 4 illustrates a timing chart that overlays respective oscillator output and enable waveforms to show how the counting window is defined.

An example of the relative timing between the oscillator output OUT and the enable signal ENABLE is shown in FIG. 4. Rising edges 402 of the oscillator output OUT are represented by upwardly pointing arrows superimposed on the signal waveform. When the enable signal ENABLE is high, the oscillator output signal OUT is regenerated by the gating logic 306 and fed to the frequency counter 304, where a count is carried out of the number of rising edges 402 detected during the interval of time defined by the enable signal ENABLE, such as interval 404.

Referring back to FIG. 3, the frequency counter 304 feeds its output to the state machine 308, which compares the generated count value to an expected value. The expected value may be based on the control signal CTL that specifies the target frequency of the oscillator output signal OUT. In one specific embodiment, the frequency counter is a synchronous device and may take the form of a ripple counter. This helps minimize metastability issues that may arise from gating the periodic oscillator output into the synchronous frequency counter.

Generally, in one embodiment, the state machine 308 may operate in accordance with an LSB-modulated capacitor code search process, described below, to evaluate the count value and generate the adjustment control signal ADJ for tuning the capacitor bank 108 to achieve the target frequency. In another embodiment, the state machine may also support an interpolation search mode, also described below, for estimating fine capacitor array sub-codewords. Selecting between an LSB-modulated binary search mode or an interpolation mode may be made via a programmed value stored in a mode register 310. The state machine 308 may also periodically generate a reset signal RESET to cause the frequency counter to start counting from a preselected reference count value, such as "0."

In one embodiment, the state machine 308 includes circuitry that is positioned electrically remote or relatively distant from the gating logic 306. In some situations, parasitics and/or other forms of electrical interference may cause undesirable distortion in the enable signal ENABLE as it propagates from the state machine 308 to the gating logic 306. As a result, a rising edge of the enable signal ENABLE, which may often be used to define the start of a count window, may have a different rise time than the falling edge, which often defines the end of a count window. In extreme cases, the distortion may create inaccuracies in defining the enable interval or counting window 404 (FIG. 4) for generating the oscillator output count.

Figure 5:
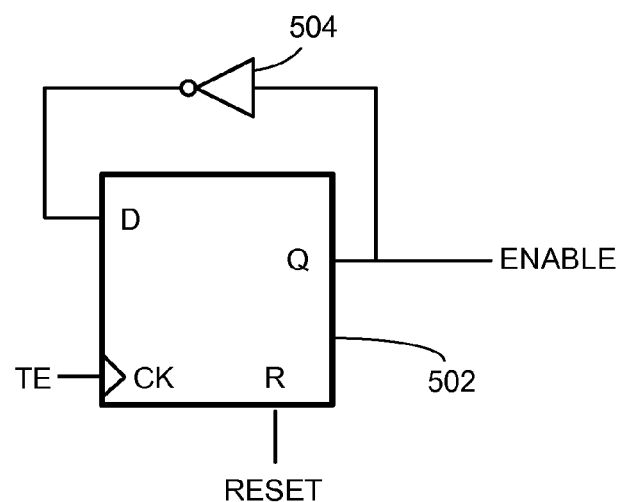
FIG. 5 illustrates further detail relating to the enable count generation circuit of FIG. 3.

To address potential distortion acting on the enable signal ENABLE, FIG. 5 illustrates additional logic, such as a flip-flop 502, that may be disposed between the state machine 308 and the gating logic 306. FIG. 5 illustrates one embodiment of the flip-flop 502, with a toggling enable signal TE generated by the state machine 308 and fed to a clock input CK of the flip-flop. The flip-flop 502 includes an output Q that couples to a data input D via an inverter gate 504. The flip-flop 502 includes a reset port R to reset the output Q to a default state. The reset port is responsive to the same reset signal RESET that is fed to the frequency counter 304 to reset the count.

Figure 6:
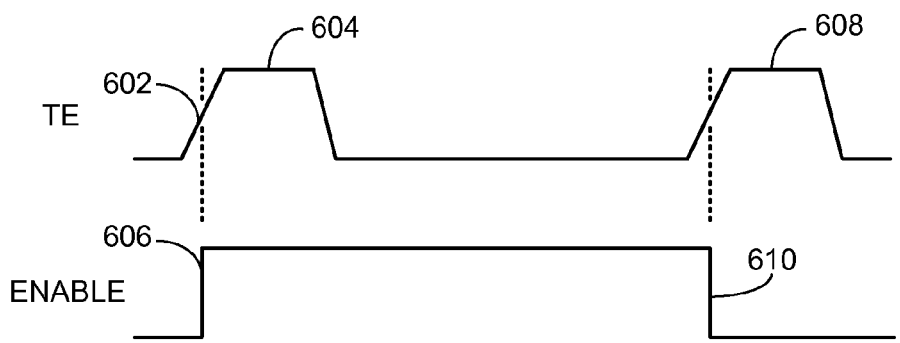
FIG. 6 illustrates a timing chart that shows an enable count waveform generated by the circuit of FIG. 5 compared to an enable count toggle waveform.

FIG. 6 illustrates the resulting timing, where a rising edge 602 of an initial pulse 604 of the toggling enable signal TE is received by the CK input of the flip-flop 502 to generate one edge of a clean and undistorted enable signal ENABLE, at 606. A second pulse 608 of the toggling enable signal TE is received at the flip-flop 502 to generate a closing edge 610 of the enable signal ENABLE. Since both rising edges of the toggling enable signal TE are used to generate the enable signal ENABLE, and since both are affected by parasitics in the same manner, the enable signal ENABLE, which is generated locally by flip-flop 502, may be generated with higher timing accuracy.

For one embodiment, the frequency synthesizer circuit 100 (FIG. 1) estimates a capacitor codeword for the capacitor bank 108 using a unique search scheme that modulates the LSB while each bit of the codeword is being determined. This enables the proper codeword to be determined with less error than is often attributable to other techniques. For purposes of clarity, the method is described in the context of determining the coarse capacitor array bits. A similar search scheme may be employed to determine the fine array bits. For embodiments where a fine array is employed, the LSB is the LSB of the fine array. Alternatively, an interpolation method may be used to determine the fine array code as explained below.

Figure 7:
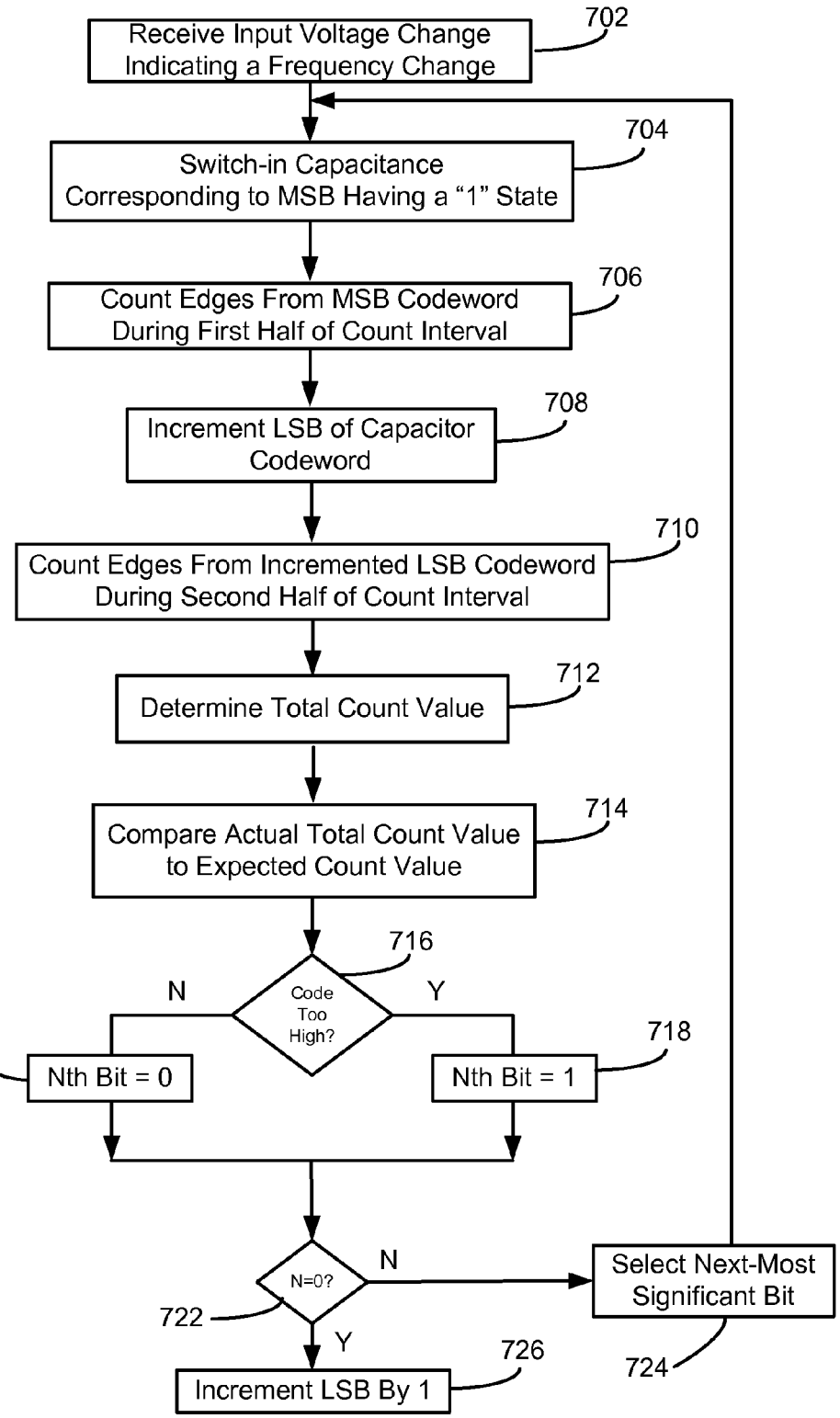
FIG. 7 illustrates a flowchart for one embodiment of an LSB modulation search method used to reduce maximum frequency estimation error during a binary search.

FIG. 7 sets out a flowchart that may be employed in the LSB modulated search method, generally designated 700. For VCO applications, the method may begin with the oscillator logic 106 receiving a change in an input voltage, thereby representing a frequency change to a desired target frequency, at 702 (and also illustrated in FIG. 1). The desired target frequency corresponds to a specific control signal value CTL, which is fed to both the capacitor control logic 104. Other applications may receive a different form of signal indicating a desired frequency change.

With the control signal CTL received, the capacitor bank 108 switches-in a capacitance corresponding to the most-significant-bit MSB of the capacitor codeword, at 704. As a specific example, for a 3-bit codeword, and a target frequency set just under the codeword value "1-1-0" (shown in FIG. 1), the initial search codeword begins with a sequence of "1-0-0." For each evaluated codeword bit, the state machine 308 defines the window for counting edges of the resulting periodic waveform from the applied codeword. For this example, during a first half of the count window, a capacitance corresponding to the initial codeword "1-0-0" will be provided for the oscillator logic 106, and the rising edges counted, at 706. However, for the second half of the count window, the capacitor array LSB of the initial codeword is incremented by 1, to a sequence of "1-0-1", at 708, and the rising edges counted based on a capacitance corresponding to the sequence "1-0-1", at 710.

At the end of the count window, the total count value is determined, at 712, from the counts taken during the first half and second half of the count window and represents an actual frequency value. The total count value may then be compared to an expected total count value, at 714. If the actual value is higher than the expected value from a determination made at 716, then the capacitance corresponding to the MSB is too low, and the MSB value is set to a "1", at 718. This corresponds to a specific embodiment where an increasing capacitor codeword represents increasing capacitance, which is inversely proportional to frequency. Other embodiments may be configured such that an increasing capacitor codeword corresponds to decreasing capacitance. In such cases, the decision for the bit is evaluated in an opposite manner. If the actual count value is lower than the expected value, then the MSB is set to a "0", at 720.

Thus, for each bit, the total count value generally corresponds to an average frequency value based on a capacitance from the codeword set by the evaluated MSB, and the capacitance resulting from the modulation or incrementing of the LSB to the codeword.

Further referring to FIG. 7, once the MSB is evaluated, a determination of whether the bit was the LSB is made, at 722. If the bit is not the LSB, then the next most significant bit may be selected for evaluation, at 724, and steps 704-720 repeated for that bit. So to continue with the specific example set out above, with the MSB bit determined to be a "1", the middle bit may then be evaluated by initially switching-in a capacitance corresponding to a codeword value of "1-1-0." The LSB-modulated codeword results in a sequence of "1-1-1." During the count evaluation, the total count may be determined to be too low, resulting from a capacitance that is too high. Thus, the middle bit may be set to a "0."

When the actual LSB undergoes its evaluation, the same steps 704-720 may be followed. Thus, with the first two of the bits determined to be "1" and "0", the LSB may be initially set to a "1" state, with the overall codeword at "1-0-1." The LSB-modulated value is "1-1-0", which is applied during the second half of the count window. The determined state for the LSB may result in a "1", and a sub-final codeword may be "1-0-1." However, unlike the previously determined bits, when the LSB is evaluated, the final codeword value may be altered by incrementing the LSB by 1, at 726 (FIG. 7). Thus, for the specific example presented, the final codeword may be "1-1-0."

An advantage to modulating the LSB for each of the bit evaluation search steps is that a maximum error between a desired target frequency, and the search capacitor codeword frequency may be reduced between adjacent codeword bits. Standard binary search methods, on the other hand, may result in maximum errors that approach an entire range of frequencies spanning the LSB. Thus, the LSB modulation search method described above provides a more accurate method of estimating the capacitor codeword, often resulting in a maximum error that is significantly less than the maximum error typically associated with binary-only search methods.

As noted above, for embodiments that employ dual capacitor arrays (both coarse and fine arrays), the fine capacitor array bits may be estimated in the same manner as the coarse array bits (LSB modulation). In some embodiments, however, the search time for the fine array may be improved using an interpolation method, such as that described below.

FIG. 8 illustrates a flowchart for one embodiment of an interpolation method, generally designated 800, to estimate a capacitor codeword for a fine capacitor array. Rather than searching for each bit sequentially, the method generally involves identifying at least two points, and relying on the linearity of the relationship between fine array sub-capacitor codeword values and frequency to identify a sub-codeword for the fine capacitor array bits that correlates with a desired target frequency.

Further referring to FIG. 8, one embodiment of an interpolation method begins by taking an accurate frequency measurement of a given bit in the fine capacitor array, such as a bit corresponding to a minimal or "zero" range for the fine capacitor array, at 802. The measurement may be carried out by counting the pulses generated by a periodic waveform resulting from the "zero" capacitance level. A similar measurement may be made, at 804, for a second value associated with the fine capacitor array, such as a bit corresponding to a maximum or "full-scale" range for the fine capacitor array. Selection of the zero and full-scale points are exemplary only, and other points within the fine capacitor array may be selected. Also, the order in which the points may be measured are arbitrary, such that a full-scale value may be measured before a zero value.

Once the two points have been measured, the linear relationship, or slope, between the measured frequencies and the corresponding sub-codewords may be determined, at 806. The relationship may then be applied, at 808, to interpolate between the two points to associate the sub-codeword values to corresponding frequency values. The estimated sub-codeword for the target frequency is then determined as the sub-codeword associated with a frequency closest to the desired target frequency, at 810. Note that the desired target frequency is a frequency value that supplements the coarse array value, thus providing finer resolution for the frequency synthesizer.

To more clearly illustrate the interpolation approach to estimating a fine capacitor array sub-codeword, FIG. 9 illustrates a graph of oscillator frequency as a function of capacitor sub-codeword values. As an example, a first measured point representing a "zero" is illustrated at 902, while a representative "full-scale" point is illustrated at 904. The interpolated slope is represented by the line at 906. The intersection of the line with the target frequency, at 908, is where an ideal capacitor sub-codeword value would lie, assuming a very high resolution. The closest sub-codeword to the intersection represents the estimated sub-codeword for the fine capacitor array.

For one embodiment, the capacitor control logic 104 (FIG. 1) may support multiple modes of operation that allow the frequency synthesizer 100 to search for capacitor array codewords in a variety of ways to optimally respond to a variety of situations. As an example, an estimated codeword for a given coarse array may be determined via a binary technique or the LSB-modulated method described herein, and a fine capacitor array sub-codeword searched via either a second LSB-modulated search sequence or an interpolation-based method. The programmable mode bits described earlier that are stored in the mode register 310 (FIG. 3) generally provide a flexible and convenient way to determine which method to employ for capacitor codeword searching.

Those skilled in the art will appreciate the benefits and advantages afforded by the embodiments described herein. By utilizing a synthesizer circuit and associated methods to estimate a target frequency with an LSB modulation scheme, a resulting capacitor code may be determined that exhibits a maximum error that is significantly less than the maximum error associated with other methods. Moreover, the apparatus and search methods described herein minimize search time while improving accuracy.

In the foregoing specification, the present embodiments have been described with reference to specific exemplary embodiments thereof. It will, however, be evident that various modifications and changes may be made thereto without departing from the scope of the disclosure as set forth in the appended claims. The specification and drawings are, accordingly, to be regarded in an illustrative sense rather than a restrictive sense.

What is claimed is:

1. A frequency synthesizer comprising:
   an oscillator including:
      an output to deliver a signal of a controllable frequency; and
      a capacitor bank responsive to a multi-bit control signal to exhibit a capacitance, the controllable frequency based on the capacitance; and
   control logic to generate the multi-bit control signal, each bit of the multi-bit control signal determined through a binary search and a modulation of a least-significant-bit (LSB) of the multi-bit control signal.

2. The frequency synthesizer according to claim 1, wherein the oscillator comprises a voltage-controlled-oscillator (VCO).

3. The frequency synthesizer according to claim 1, wherein the control logic comprises:
   a counter having an input to receive the signal and to generate a count of a number of periods of the signal within an enabled timing interval; and
   a state machine to control a frequency search of the multi-bit control signal associated with the signal, the state machine to generate an enable signal to define the enabled timing interval.

4. The frequency synthesizer according to claim 3 and further comprising:
   gating logic, coupled to the oscillator and disposed between the state machine and the counter, to selectively pass the signal to the counter in response to the enable signal.

5. The frequency synthesizer according to claim 1 wherein the capacitor bank includes a coarse array of multiple equally spaced-apart levels, the multi-bit control signal comprising a capacitor code corresponding to one of the levels.

6. The frequency synthesizer according to claim 5, further comprising:
   a fine array of multiple equally spaced-apart levels within one of the levels of the coarse array.

7. The frequency synthesizer according to claim 5, further comprising:
a fine array of multiple equally spaced-apart levels within one of the levels of the coarse array and overlapping into a second level of the coarse array.

8. A method of synthesizing a signal of a desired frequency from an inductor-capacitor (LC) oscillator, the method comprising:
setting a target signal frequency; and
searching for a multi-bit capacitor codeword corresponding to the desired frequency, the searching including evaluating each bit of the multiple bits by:
during a first portion of a time interval, generating a first value attributable to the bit and any other previously determined bits;
during a second portion of the time interval, incrementing a least-significant-bit (LSB) of the multi-bit capacitor codeword and generating a second value attributable to the evaluated bit, any other previously determined bits, and the incremented LSB, and
determining a state of the evaluated bit based on a combination of the first and second values.

9. The method according to claim 8, further comprising:
counting periods of a first signal to generate a first count;
counting periods of a second signal to generate a second count;
summing the first and second counts; and
determining the state of the evaluated bit based on a frequency corresponding to the summed first and second counts.

10. The method according to claim 9, wherein a maximum error between the desired frequency and the target signal frequency is half of a frequency range corresponding to one of the multiple bits.

11. The method according to claim 9, wherein determining the state of the evaluated bit comprises:
comparing the summed first and second counts to an expected value; and
selecting the state based on the comparison.

12. The method according to claim 11, wherein after evaluating a state of the last of the N bits, the method further comprises:
incrementing the LSB.

13. The method according to claim 12, wherein the last bit comprises the LSB.

14. A frequency synthesizer comprising:
means for setting a target signal frequency; and
means for searching for a multi-bit capacitor codeword corresponding to a desired frequency, the means for searching to evaluate each bit of the multiple bits by:
during a first portion of a time interval, generating a first value attributable to the bit and any other previously determined bits;
during a second portion of the time interval, incrementing a least-significant-bit (LSB) of the multi-bit capacitor codeword and generating a second value attributable to the evaluated bit, any other previously determined bits, and the incremented LSB, and
determining a state of the evaluated bit based on a combination of the first and second values.

15. A method of synthesizing a signal of a desired frequency from an inductor-capacitor (LC) oscillator, the method comprising:
setting a target signal frequency;
in a first mode, searching for a multi-bit capacitor codeword corresponding to the desired frequency using an LSB-modulation technique; and
in a second mode, searching for the multi-bit capacitor codeword corresponding to the desired frequency using a binary search technique.

16. The method of claim 15, and further comprising:
programmably selecting between the first and second modes.

* * * * *